United States Patent [19]

Bakos et al.

[11] 4,009,033

[45] Feb. 22, 1977

[54] HIGH SPEED POSITIVE PHOTORESIST COMPOSITION

[75] Inventors: Peter Bakos; John Rasile, both of Endicott, N.Y.

[73] Assignee: International Business Machines Corporation, Armonk, N.Y.

[22] Filed: Sept. 22, 1975

[21] Appl. No.: 615,636

[52] U.S. Cl. .................................. 96/33; 96/36; 96/36.2; 96/36.3; 96/49; 96/75; 96/91 D
[51] Int. Cl.$^2$ ...................... G03C 1/54; G03F 7/08
[58] Field of Search ................. 96/91 D, 115 R, 33, 96/36, 36.2, 36.3, 49, 75; 427/43

[56] References Cited

UNITED STATES PATENTS

| | | | |
|---|---|---|---|
| 3,046,121 | 7/1962 | Schmidt | 96/91 D |
| 3,615,532 | 10/1971 | Silver | 96/91 D |
| 3,661,582 | 5/1972 | Broyde | 96/91 D |
| 3,666,473 | 5/1972 | Colom et al. | 96/91 D |
| 3,759,711 | 9/1973 | Rauner et al. | 96/91 D |
| 3,869,292 | 3/1975 | Peters | 96/91 D |

FOREIGN PATENTS OR APPLICATIONS

| | | | |
|---|---|---|---|
| 1,039,475 | 8/1966 | United Kingdom | 96/91 D |
| 1,187,814 | 4/1970 | United Kingdom | 96/91 D |

OTHER PUBLICATIONS

"IBM Tech. Disclosure Bulletin", vol. 13, No. 4, p. 903, Sept. 1970.
Chemical Abstracts, 68: P25,445r, 1968.
Chemical Abstracts, 75: PG9,543v, 1971.
Chemical Abstracts, 78: P77327e, 1973.
Chemical Abstracts, 79: P72306b, 1973.
Chemical Abstracts, 81: P8437r, 1974.
Chemical Abstracts, 81: P56690q, 1974.

*Primary Examiner*—Charles L. Bowers, Jr.
*Attorney, Agent, or Firm*—Sughrue, Rothwell, Mion, Zinn & Macpeak

[57] ABSTRACT

A positive photoresist having increased sensitivity to light and formed by the addition of an acidic compound to a 1,2-quinone-diazide sulphonic acid ester sensitizer.

12 Claims, No Drawings

HIGH SPEED POSITIVE PHOTORESIST COMPOSITION

BACKGROUND OF THE INVENTION

1. Field of the Invention

The invention covers the addition of novel sensitizers to positive photoresists to increase their sensitivity to light. This invention has particular application in, but is not limited to, the formation of printing surfaces, formed by a flash exposure process.

2. Discussion of the Prior Art

A positive photoresist is an organic material, which when exposed to radiation, undergoes chemical reactions which result in an increased solubility of the exposed material.

Quinone diazides provide a useful mechanism in achieving a solubility difference between exposed and unexposed portions of a photoresist. The reaction sequence is believed to be as follows:

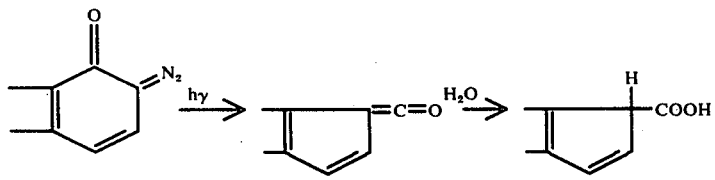

Thus, the portion of the quinone diazide photoresist exposed to radiation will have increased solubility to an alkaline solution.

Therefore, such coatings have potential utility in forming photo-resists for metal plating and for the etching of metal plates, ceramics or the like in a pattern for the manufacture of printed circuits and printing plates.

In the production of printing plates the photoresist composition is coated on a support such as a metal plate or foil, e.g., aluminum or zinc. After drying, the plate is exposed under a positive or negative master to the action of radiation and is then developed. Development in an alkaline solution will cause removal of the portion exposed to radiation.

With exposure through a positive master and alkaline development, the finished plate has a raised portion conforming to the desired image. When the printing plate is inked with a greasy ink, the ink adheres to the raised portions of the plate which are formed by the remaining unexposed photoresist. From this plate can then be obtained positive copies corresponding to the positive master. Alternatively, the plate can be etched with the subsequent removal of the photoresist.

With exposure through a negative master, the exposed photoresist is removed with an alkaline solution and the plate can then be plated with the photoresist acting as a plating mask. Subsequently, the photoresist is removed to give a printing plate.

These processes have been described in U.S. Pat. Nos. 3,046,118, 3,106,465, 3,148,983 and 3,402,044.

Compounds containing two or more nitrogen atoms, at least one of which is bonded to a hydrogen atom, are disclosed in U.S. Pat. No. 3,661,582 as additives to increase the sensitivity of quinone diazide photoresists.

OBJECT OF THE INVENTION

It is an object of this invention to provide novel additives for photoresist compositions which increase sensitivity to radiation and which are easily prepared.

It is a further object of this invention to reduce the exposure time of photoresists and thus lower costs.

It is also an object of this invention to provide a photoresist capable of flash exposure to produce image resolutions with acceptable dimensional stability.

SUMMARY OF THE INVENTION

It has been found that the novel addition of organic acids to quinone diazide photoresists results in a photoresist composition requiring shorter exposure periods.

The improved photoresists of this invention can be easily formed by adding an organic acid solution to various commercially available quinone diazide type photoresist preparations.

DETAILED DESCRIPTION OF THE INVENTION

The novel photoresist materials of this invention comprise a resin and a quinone-diazide type sensitizer, which are commercially available together as a photoresist, and an organic acidic compound.

Suitable photoresists are exemplified by the AZ photoresists available from the Shipley Company and designated AZ-1350, AZ-111, AZ-165, AZ-340, and AZ-345. The solids portion of the AZ-1350 photoresist comprises a m-cresol formaldehyde resin having the formula

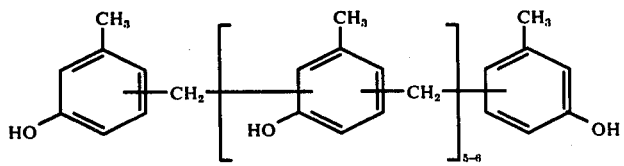

and a light sensitive or electron beam sensitive diazo sensitizer, such as, the 4', 2', 3'-dihydroxybenzophenone ester of 1-oxo-2-diazonaphthalene-5-sulphonic acid shown below:

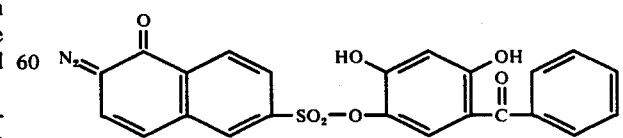

The solids portion of a photoresist within the scope of this invention may have more than one resin component. For example, the AZ-111 photoresist contains a cresol-formaldehyde resin in addition to a polyvinyl methyl ether resin. Additionally, the resin component may be an ALNOVOL resin manufactured by the American Hoechst Corporation, such as, ALNOVOL 429K.

The photoresist may contain various additives such as a dye, the Sudan Blue II dye being found in the AZ-340 photoresist.

Further, the photoresist may contain an adhesion promoter such as and organo-silicon compound, for example beta-(3, 4-epoxycyclohexyl) ethyltrimethoxysilane, para-methyldisilane methylmethacrylate, gamma-aminopropyl triethoxysilane and vinyltrichlorosilane. Preferably, the adhesion promoter is added in an amount from about 0.01% to about 2% w/w to the polymer of the photoresist.

A plasticizer may be a component of the photoresist of this invention. These plasticizers include dl-camphor, stearic or other fatty acids and polymeric plasticizers. Polymeric plasticizers can be added in amounts up to about 5% w/w to the polymer in the photoresist and can be chosen from materials such as acetal resins, acrylic resins, phenoxy resins, polypropylene, alkyd resins, allyl resins and esters, amino resins, melamine resins and epoxy resins.

The novel sensitizers of this invention are acidic organic compounds which may be used alone or in combination in an amount from about 0.01% to about 15% w/w with respect to the polymer of the photoresist. The following Table I lists examples of acid compound categories and specific examples which are within the scope of this invention.

TABLE I

A. Dibasic Carboxylic Acids
1. Oxalic Acid
2. Malonic Acid
3. Succinic Acid
4. Glutaric Acid
5. Adipic Acid
6. Pimelic Acid
7. Suberic Acid
8. Maleic Acid
B. Monobasic unsaturated Aromatic Acids
1. Nitro-cinnamic Acid
2. Nitro-phenyl Propiolic Acid
C. Pyridine Carboxylic Acids
1. Picolinic Acid
2. Nicotinic Acid
3. Iso-nicotinic Acid
D. Hydroxyphthalic Acids
1. 2, 5-Dihydroxyterphthalic Acid
2. Succinylo-succinic Acid (also known as p-dihydroxy-dihydro-terephthalic acid)
E. Unsaturated Monobasic Phenolic Acids
1. Coumaric Acid
2. Coumarillic Acid
F. Substituted Phenols
1. Picric Acid In the application of the novel photoresist, the commercially obtained photoresist comprising the quinone diazide compound and the resin is dissolved in a suitable solvent and the acid sensitizer of this invention is added. The optional ingredients such as a dye, an adhesion promoter and a plastizer, as explained above, may be added.

Suitable supports for the photoresist of this invention include copperclad laminates, glass/metal, and metallized ceramic modules.

Coating techniques include dip, spray and spin coating methods.

After exposure to actinic radiation through a transparency, development is effected by the immersion of the resist-coated support into a mild alkaline solution. The exposed portion of the photoresist is thus washed off, leaving the unexposed portion uneffected on the sample. The plate can then be etched or plated with the photoresist still on the plate acting as a mask. After etching or plating, the unexposed film can be removed with a solvent such as acetone or N-methyl-2-pyrrolidone, or re-exposed to radiation and removed by alkaline solution.

Adjustment of the dilution of the alkaline developer with water will affect the rate of removal of exposed photoresist as well as the development time required. The invention will now be demonstrated by way of a comparative example.

EXAMPLE

Acid sensitizers within the scope of this invention were added to the photoresist designated AZ-1350H of the quinone-diazide type. The compositions were then applied to a support in equal thickness of approximately 5μ and exposed to actinic radiation through a step wedge film. By calculating the density of each step of the film the following increases in sensitivity were found over the AZ-1350H photoresist alone.

TABLE II

| SENSITIZER | Amount of Sensitizer (w/w of Polymer) | | |
| --- | --- | --- | --- |
|  | 5% | 10% | 15% |
| Picric Acid | 2.15 | 3.20 | 4.90 |
| Nicotinic Acid | 1.80 | 2.30 | 2.60 |
| Nitrocinnamic Acid | 1.10 | 1.60 | 1.90 |
| Oxalic Acid | 0.25 | 0.70 | 0.80 |
| Coumaric Acid | 0.15 | 0.25 | 0.40 |

Therefore, the addition of 5% by weight of the polymer, of picric acid increased the sensitivity of AZ-1350H photoresist 2.15 times. When 20% w/w of picric acid was used the sensitivity improved, but after solvent development the image resolution was poor.

The marked improvements in sensitivity afforded by the addition of the acidic compounds of this invention made flash exposures possible, reducing the time and expense required in the production of printing plates and other products requiring the use of photoresists.

In the formulation of a typical photoresist of this invention the following additive composition was added to 946 cc of an "AZ" commercial photoresist:

| | |
| --- | --- |
| xylene | 94.5g |
| stearic acid | 0.4g |
| picric acid | 4.50g |
| gamma-aminopropyltriethoxy silane | 0.6g |

It will be obvious to those skilled in the art that many modifications may be made within the scope of the present invention without departing from the spirit thereof, and the invention includes all modification within the scope of the appended claims.

What is claimed is:

1. A positive photoresist composition developable in an alkaline solution comprising an admixture of a resin, a light-sensitive or electron beam-sensitive 1, 2-quinone-diazide sulfonic acid ester sensitizer and an acid compound selected from the group consisting of picric acid, nicotinic acid and nitrocinnamic acid in admixture characterized by increased sensitivity to light or electron beams as a result of the presence of said acid compound wherein said acid compound is present in an amount such that satisfactory image resulution is obtained.

2. The composition as claimed in claim 1, wherein said resin is a m-cresol formaldehyde resin.

3. In a process for generating a pattern on a substrate coated with a positive photoresist comprising an admixture of a resin, a light-sensitive or electron beam-sensitive 1, 2-quinone-diazide sulfonic acid ester by exposure to an electron beam or light and development in an alkaline solution, the improvement comprising adding an acid compound to said admixture of the photoresist, said compound is selected from the group consisting of picric acid, nicotinic acid and nitrocinnamic acid in an amount such that increased sensitivity and satisfactory image resolution are obtained.

4. The process of claim 3, wherein said resin is a m-cresol formaldehyde resin.

5. A positive photoresist composition developable in an alkaline solution comprising an admixture of a resin, a light-sensitive or electron beam-sensitive 1, 2-quinone-diazide sulfonic acid ester sensitizer and picric acid, said composition is characterized by increased sensitivity to light or electron beams as a result of the presence of said picric acid wherein said picric acid is present in an amount such that satisfactory image resolution is obtained.

6. The composition as claimed in claim 5, wherein said resin is a m-cresol formaldehyde resin.

7. The composition as claimed in claim 5, further comprising an adhesion promoter.

8. The composition as claimed in claim 5, further comprising a dye.

9. In a process for generating a pattern on a substrate coated with a positive photoresist comprising an admixture of a resin, a light-sensitive or electron beam-sensitive 1, 2-quinone-diazide sulfonic acid ester by exposure to an electron beam or light and development in an alkaline solution, the improvement comprising adding picric acid to said admixture of the photoresist which increases the sensitivity of said photoresist in an amount such that satisfactory image resolution is obtained.

10. The process as claimed in claim 9, wherein said resin is a m-cresol formaldehyde resin.

11. The process as claimed in claim 9, wherein an adhesion promotor is additionally added.

12. The process as claimed in claim 9, wherein a dye is additionally added.

* * * * *